United States Patent
Lee et al.

(10) Patent No.: US 11,178,766 B2
(45) Date of Patent: Nov. 16, 2021

(54) INNER MODULE WITH A RETAINER

(71) Applicant: CONCRAFT HOLDING CO., LTD., Grand Cayman (KY)

(72) Inventors: Chin-Hsing Lee, New Taipei (TW); Jin-Bo Peng, Kunshan (CN); Chang-Hsien Tung, New Taipei (TW)

(73) Assignee: CONCRAFT HOLDING CO., LTD., Grand Cayman (KY)

( * ) Notice: Subject to any disclaimer, the term of this patent is extended or adjusted under 35 U.S.C. 154(b) by 126 days.

(21) Appl. No.: 16/366,062

(22) Filed: Mar. 27, 2019

(65) Prior Publication Data
US 2020/0205287 A1    Jun. 25, 2020

(30) Foreign Application Priority Data

Dec. 20, 2018  (TW) .................................. 107146201

(51) Int. Cl.
*H05K 1/00*    (2006.01)
*H05K 1/14*    (2006.01)
*H04R 1/02*    (2006.01)
*H04R 3/00*    (2006.01)

(52) U.S. Cl.
CPC ............. *H05K 1/142* (2013.01); *H04R 1/025* (2013.01); *H04R 3/00* (2013.01); *H05K 2201/045* (2013.01); *H05K 2201/10393* (2013.01)

(58) Field of Classification Search
CPC ............. H05K 1/142; H05K 2201/045; H05K 2201/10393; H04R 1/025; H04R 3/00
See application file for complete search history.

(56) References Cited

U.S. PATENT DOCUMENTS

| | | | |
|---|---|---|---|
| 8,100,010 B2* | 1/2012 | Fly | G01P 15/18 73/493 |
| 9,052,220 B2* | 6/2015 | Sakuma | G01D 11/30 |
| 9,404,755 B2* | 8/2016 | Watanabe | G01C 25/00 |
| 9,794,459 B1* | 10/2017 | Kim | G03B 5/00 |
| 2003/0011980 A1* | 1/2003 | Albrecht | G06F 1/187 361/679.34 |
| 2006/0110096 A1* | 5/2006 | Terada | G02B 6/4283 385/14 |
| 2008/0117324 A1* | 5/2008 | Minamio | H04N 5/22521 348/340 |
| 2008/0144302 A1* | 6/2008 | Rosenblatt | G08B 17/10 361/809 |
| 2011/0075329 A1* | 3/2011 | Cho | H05K 7/142 361/679.01 |

* cited by examiner

*Primary Examiner* — Pete T Lee
(74) *Attorney, Agent, or Firm* — Muncy, Geissler, Olds and Lowe, P.C.

(57) ABSTRACT

An inner module with a retainer is installed primarily inside a wireless earphone, including a circuit loop, an insulation seat to fix the circuit loop, and at least a retainer. The circuit loop includes at least a first circuit board, and at least a second circuit board which is extended from the first circuit board. The insulation seat includes at least a base plate to enclose the first circuit board, and a first side wall which is extended from the base plate. The first side wall is provided with a first positioning slot to accommodate the second circuit board. The retainer is fixed on the first side wall to fix the second circuit board in the first positioning slot. Therefore, the inner module is formed into a modularized design to simplify the assembly procedure of the wireless earphone.

7 Claims, 7 Drawing Sheets

INNER MODULE WITH A RETAINER

BACKGROUND OF THE INVENTION a) Field of the Invention

The present invention relates to an inner module with a retainer, and more particularly to an inner module which is installed inside a wireless earphone by a modularized design and is able to reduce the assembly cost significantly.

b) Description of the Prior Art

An earphone is connected to an electronic device, so as to transmit the sound played by that electronic device to a user's ears. An ordinary earphone includes a wired earphone and a wireless earphone (such as the AIRPODS issued by the Apple, Inc.), wherein the wired earphone is connected to the electronic device through a wire, and the wireless earphone is connected to the electronic device through a wireless communication technology such as Bluetooth.

As the wired earphone must use a wire to connect to the electronic device, the range of use is limited. In addition, the wired earphone can be pulled and stretched easily due to the existence of wire, and the wire can be easily intertwined upon collecting the wired earphone. On the other hand, as the wireless earphone transmits the sound through the wireless communication technology, the range of use is farther than that of the wired earphone, and is without the problem of easy pulling and stretching or intertwining of the wire. Therefore, the wireless earphone has been replacing the wired earphone gradually.

For an ordinary earphone, in addition to that its exterior is enclosed by a casing, the interior is usually provided with a circuit board, and a loudspeaker; whereas, the interior of the wireless earphone should be further provided with a battery, a microphone and a wireless communication module. As a wireless earphone has more internal parts, when the ordinary wireless earphone is being assembled, the circuit board, the loudspeaker, the battery, the microphone, and the wireless communication module should be installed and fixed inside the casing orderly. Therefore, it will require a lot of manpower to assemble the wireless earphone, which increases the labor cost. Furthermore, as the wireless earphone is small in size, the internal space of assembly is limited, which can easily damage the parts by carelessly assembling, thereby decreasing the yield of assembly.

Accordingly, the technical means and the object thereof to be solved by the present invention are the provision of an inner module which is installed inside a wireless earphone by a modularized design and is able to reduce the assembly cost significantly.

SUMMARY OF THE INVENTION

The primary object of the present invention is to provide an inner module with a retainer, and more particularly to an inner module which is installed inside a wireless earphone by a modularized design and is able to reduce the assembly cost significantly.

To achieve the aforementioned object, the present invention discloses an inner module with a retainer, comprising a circuit loop, an insulation seat, and at least a first retainer. The circuit loop includes at least a first circuit board and at least a second circuit board which is extended from the first circuit board. The insulation seat includes at least a base plate to enclose the first circuit board, and a first side wall which is extended from the base plate. The first side wall is provided with a first positioning slot to accommodate the second circuit board, and the first retainer is fixed on the first side wall to fix the second circuit board in the first positioning slot.

In an embodiment, the circuit loop further includes a third circuit board which is extended from the first circuit board to oppose the second circuit board.

In an embodiment, the insulation seat further includes a second side wall which is extended from the base plate to oppose the first side wall, and the second side wall is provided with a second positioning slot to accommodate the third circuit board.

In an embodiment, the insulation seat further includes a connecting wall which is opposite to the base plate and connects the first side wall and the second side wall, allowing the insulation seat to be formed with a holding space to accommodate a power supply unit. In addition, when the power supply unit is accommodated in the holding space, the power supply unit is connected electrically with the circuit loop.

In an embodiment, the connecting wall is further provided with a rabbet to accommodate a loudspeaker, and when the loudspeaker is accommodated in the rabbet, the loudspeaker is connected electrically with the circuit loop.

In an embodiment, the inner module further includes a second retainer which is fixed on the second side wall to fix the third circuit board in the second positioning slot.

In an embodiment, at least a pair of second fastening structure is disposed between the second side wall and the second retainer.

In an embodiment, the second fastening structure includes a second fastening hole which is disposed on the second side wall, as well as a second fastening bump which is disposed on the second retainer to be engaged with the second fastening hole.

In an embodiment, at least a pair of first fastening structure is disposed between the first side wall and the first retainer.

In an embodiment, the first fastening structure includes a first fastening hole which is disposed on the first side wall, as well as a first fastening bump which is disposed on the first retainer to be engaged with the first fastening hole.

In comparison to the prior arts, the inner module with the retainer, according to the present embodiment, is provided with following advantages that:

1. Through the insulation seat, the circuit loop, the power supply unit and the loudspeaker can be integrated together directly, forming a modularized inner module to reduce the labor cost in assembling the wireless earphone significantly.
2. The shape of the insulation seat can be changed according to the configuration of the wireless earphone, so that the inner module can be applied to the wireless earphones in various configurations.

To enable a further understanding of said objectives and the technological methods of the invention herein, a brief description of the drawings is provided below followed by a detailed description of the preferred embodiments.

DETAILED DESCRIPTION OF THE PREFERRED EMBODIMENTS

Figure 1:
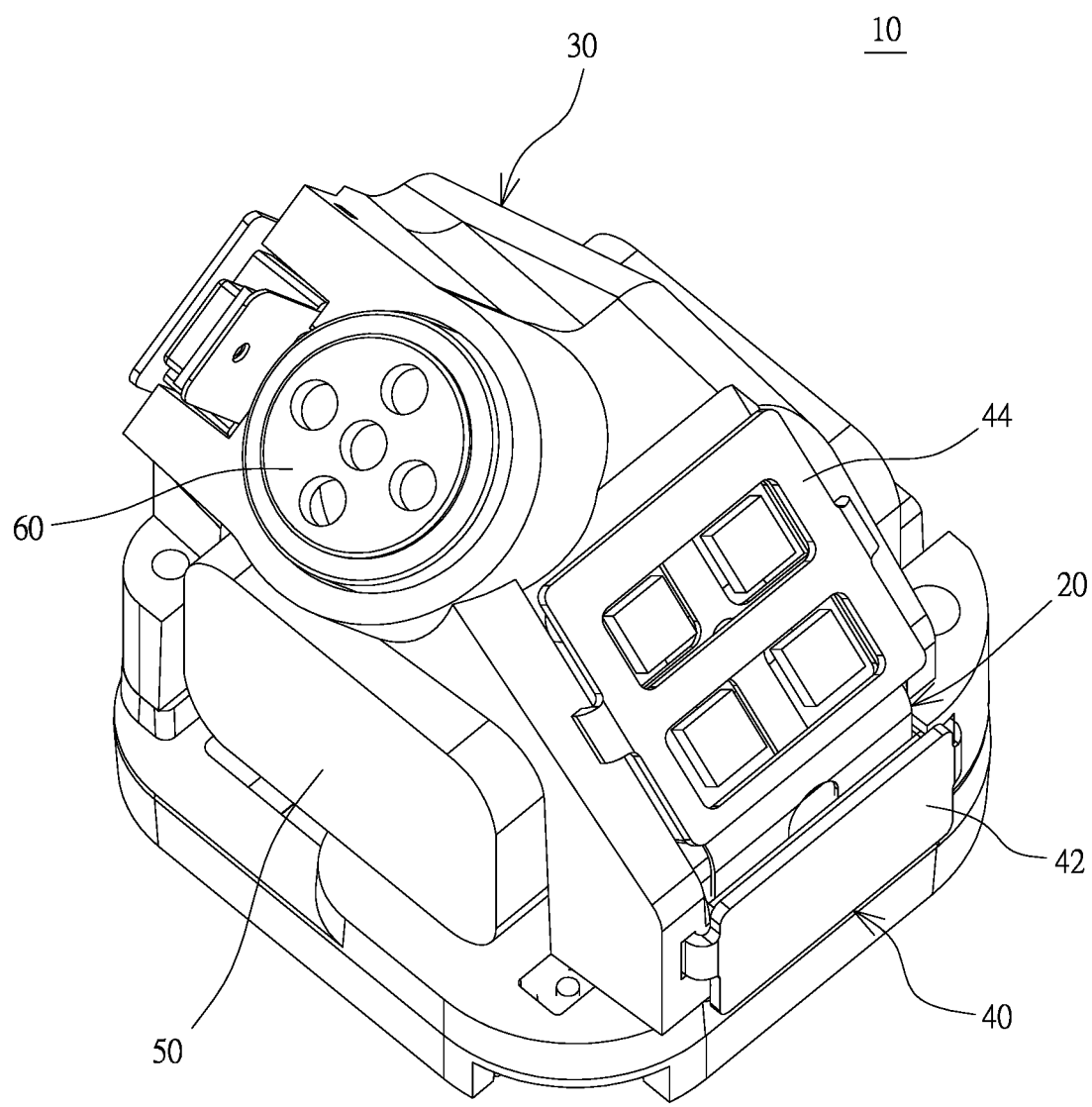
FIG. 1 shows a schematic view at a first viewing angle of the present invention in a usage state.
Figure 2:
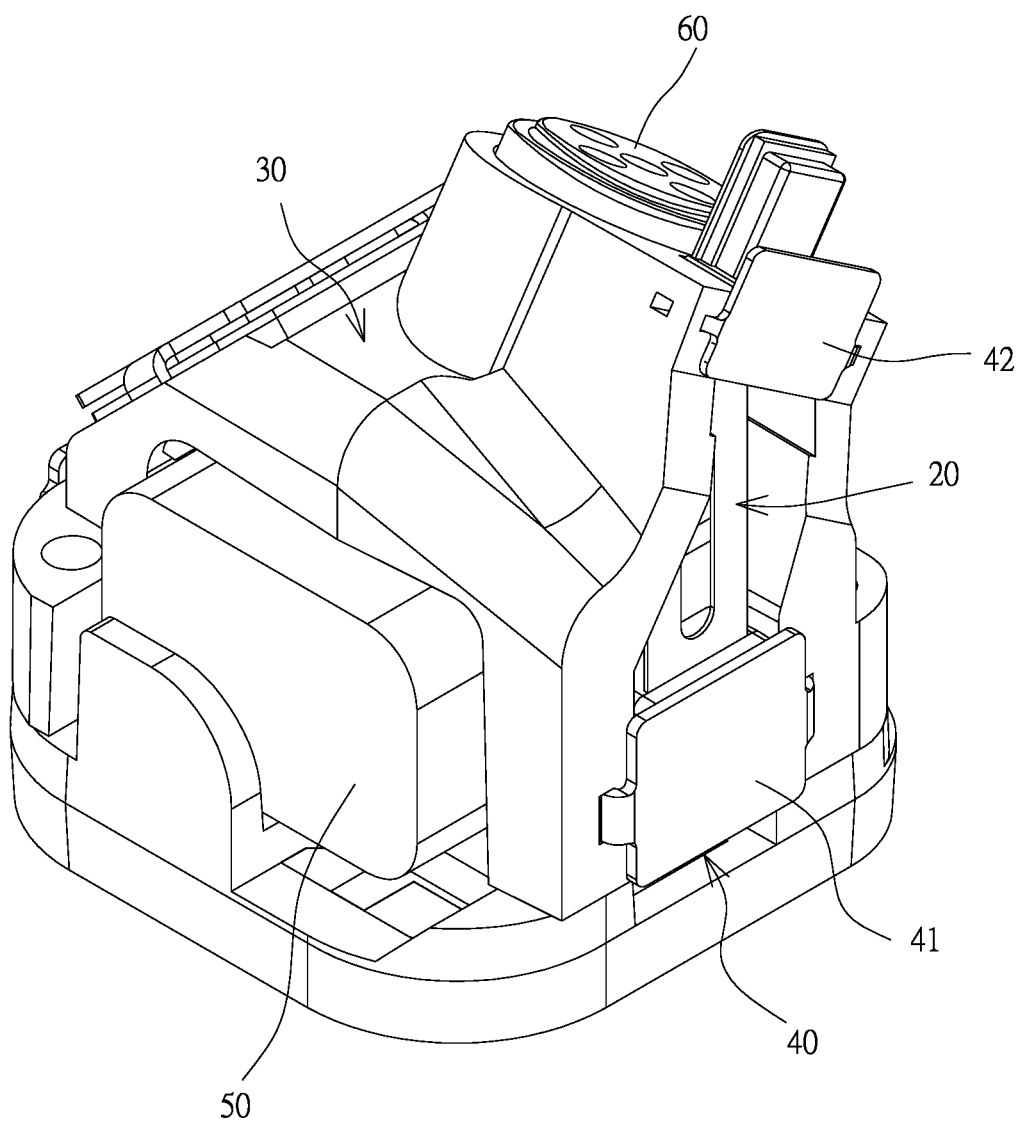
FIG. 2 shows a schematic view at a second viewing angle of the present invention in the usage state.
Figure 3:
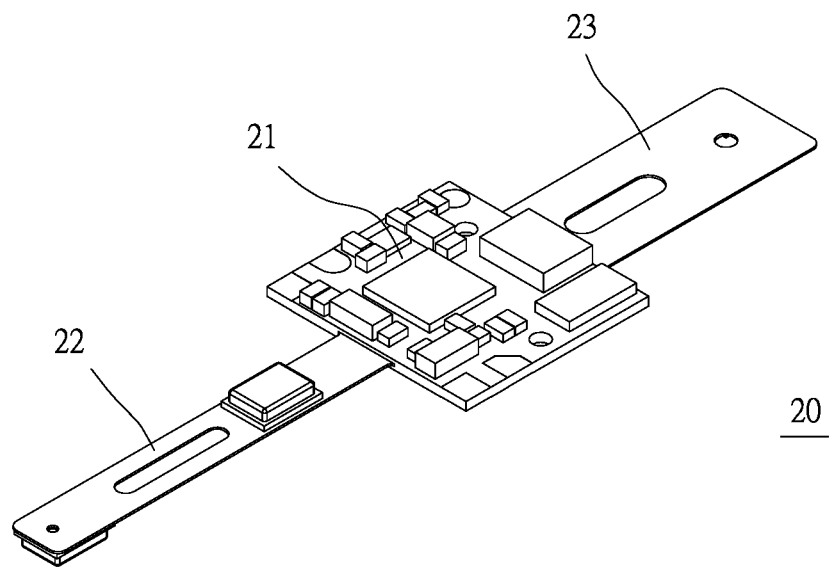
FIG. 3 shows a three-dimensional schematic view a circuit loop in the present invention.
Figure 4:
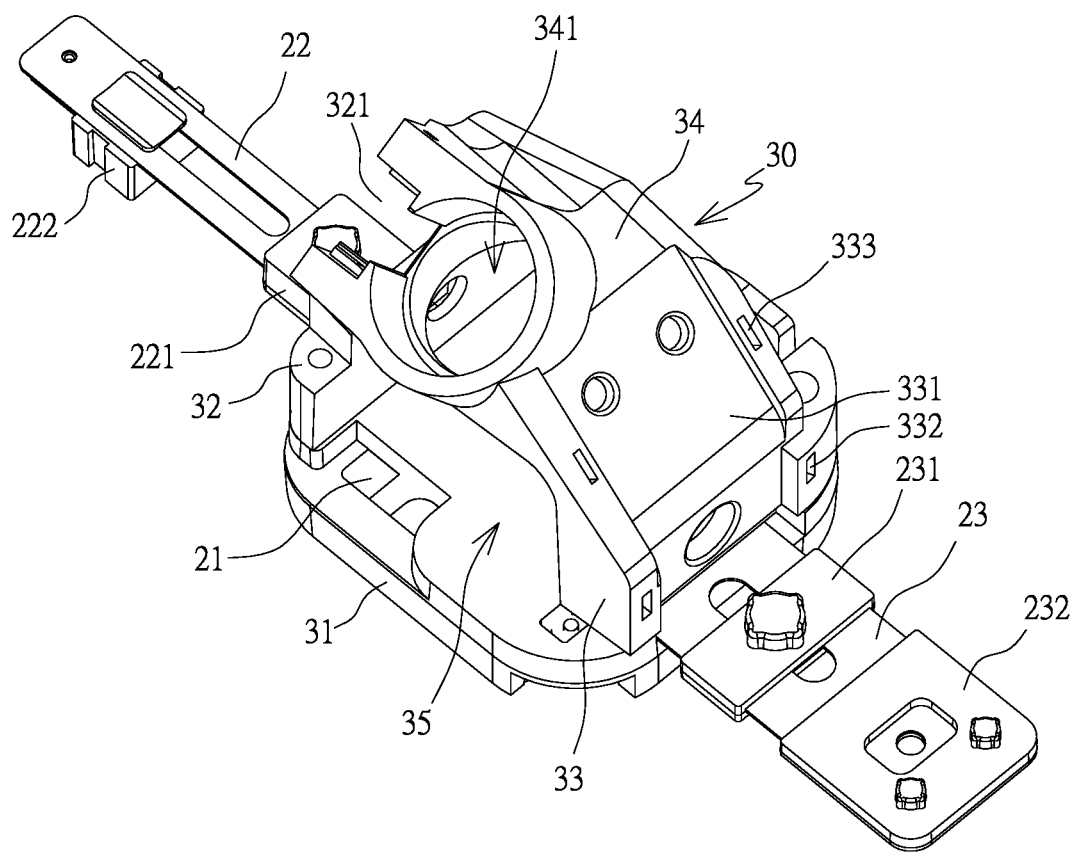
FIG. 4 shows a schematic view at a first viewing angle of the present invention where an insulation seat is formed on the circuit loop.
Figure 5:
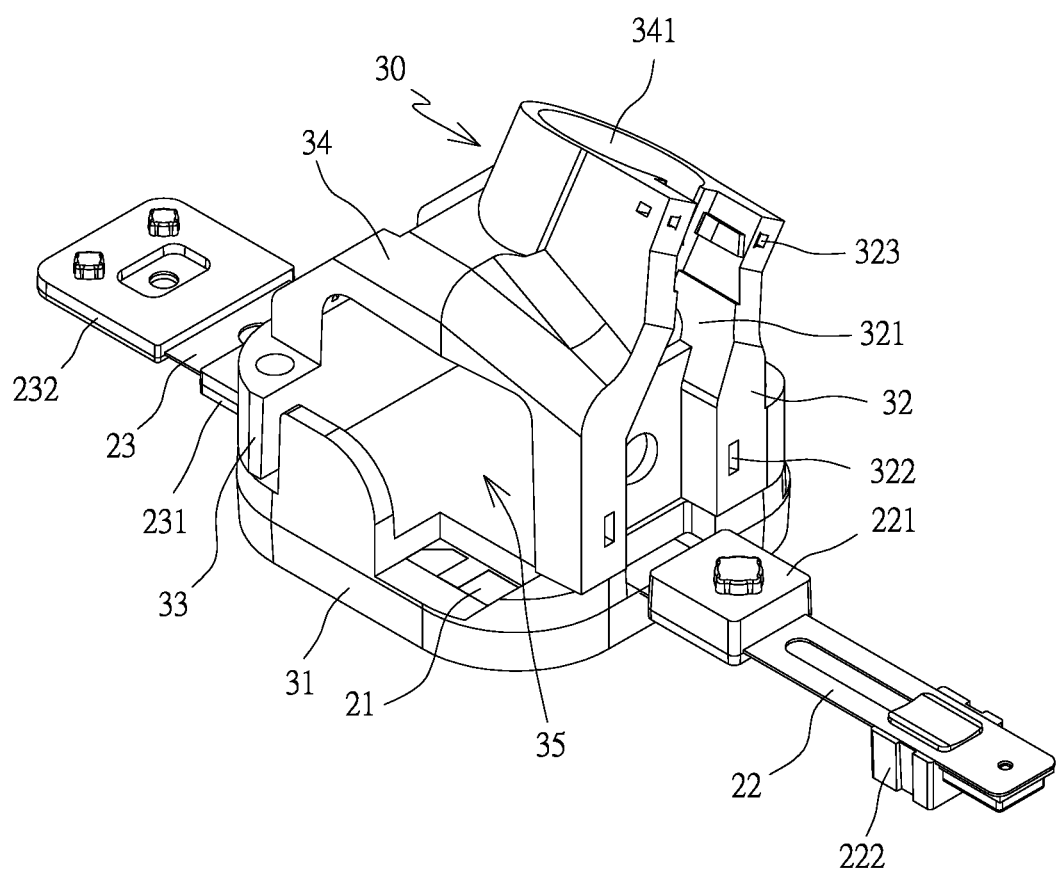
FIG. 5 shows a schematic view at a second viewing angle of the present invention where the insulation seat is formed on the circuit loop.
Figure 6:
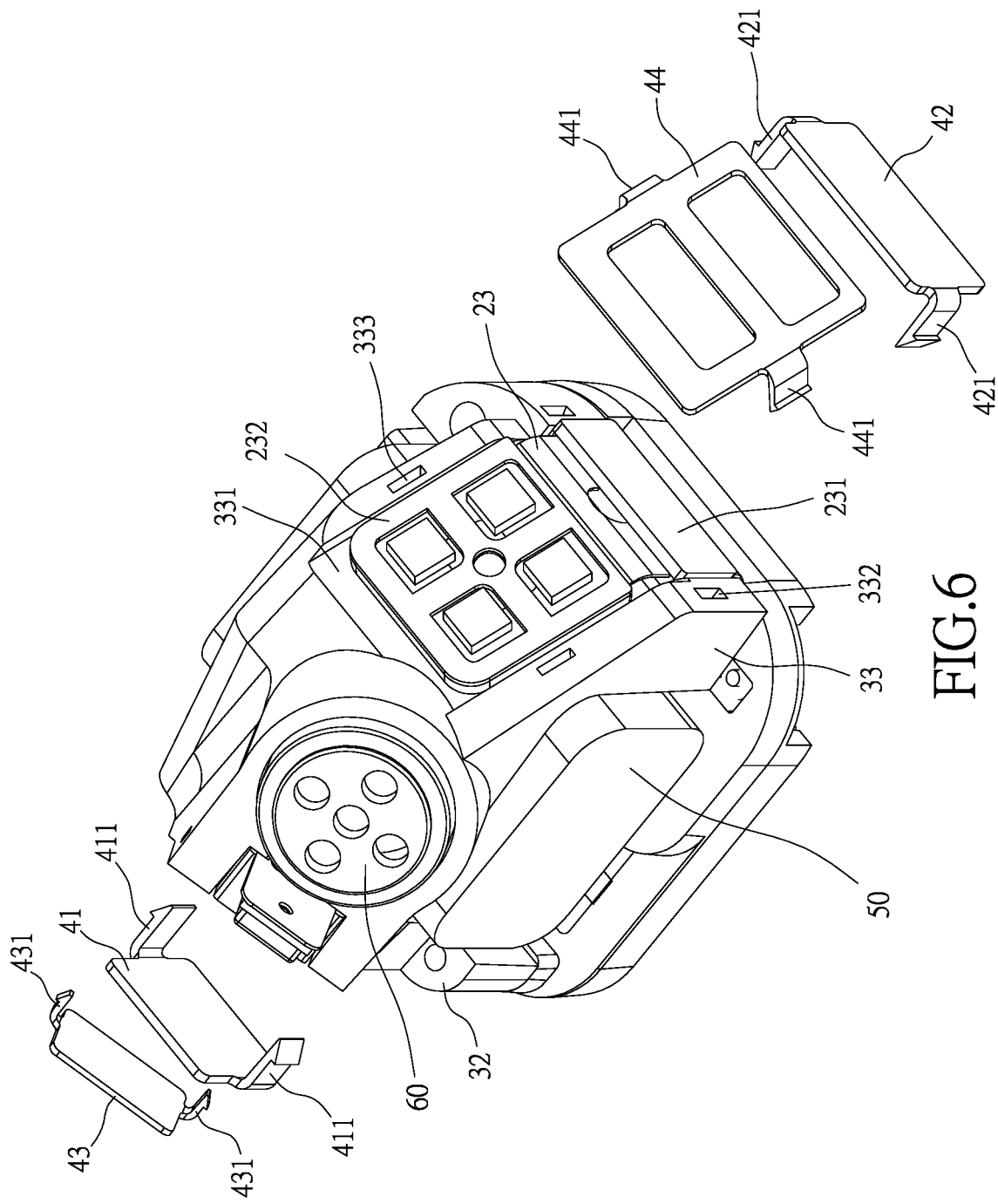
FIG. 6 shows a schematic view at a first viewing angle of the present invention where a retainer is separated from the insulation seat.
Figure 7:
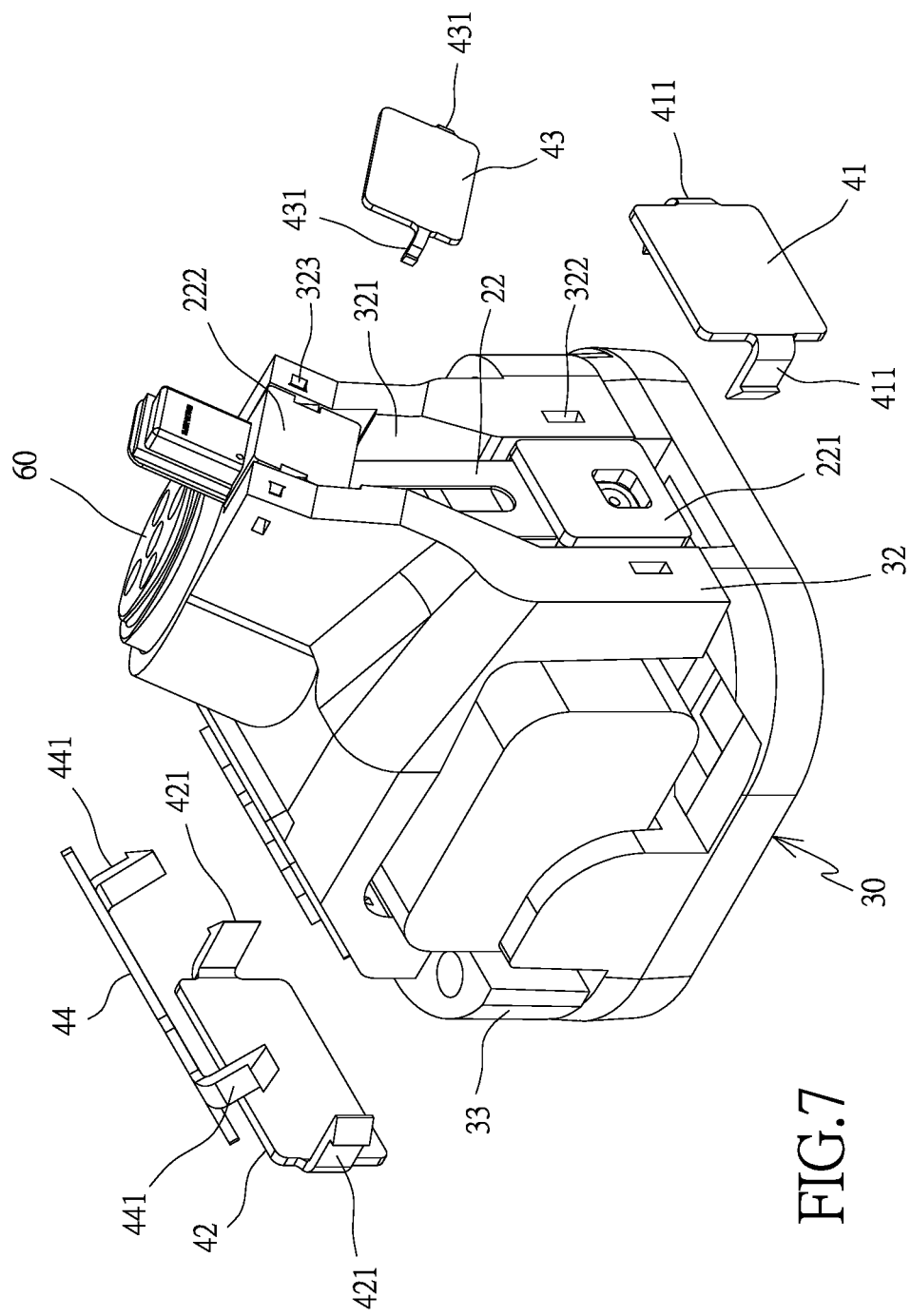
FIG. 7 shows a schematic view at a second viewing angle of the present invention where the retainer is separated from the insulation seat.

Referring to FIGS. 1 to 7, the present invention discloses an inner module with a retainer which is installed in a casing of wireless earphone (no further description is disclosed as it belongs to the prior arts), comprising a circuit loop 20, an insulation seat 30, at least a retainer 40, a power supply unit 50 and a loudspeaker 60.

The circuit loop 20 is constituted by a first circuit board 21, a second circuit board 22 and a third circuit board 23. The first circuit board 21 is a hard circuit board; whereas, the second circuit board 22 and the third circuit board 23 are a soft circuit board respectively, and are extended from two opposite sides of the first circuit board 21, enabling the second circuit board 22 to oppose the third circuit board 23. In addition to that the circuit loop 20 is assembled by the hard circuit board and the soft circuit boards, the circuit loop 20 can be also formed by the soft circuit boards alone or the hard circuit boards alone. Furthermore, the first circuit board 21, the second circuit board 22 and the third circuit board 23 are connected with one another electrically.

The insulation seat 30 is used to fix the circuit loop 20, including a base plate 31 to enclose the first circuit board 21, a first side wall 32 which is extended from the base plate 31, a second side wall 33 which is extended from the base plate 31 to oppose the first side wall 32, and a connecting wall 34 which connects the first side wall 32 and the second side wall 33 to oppose the base plate 31. In addition, by using the base plate 31, the first side wall 32, the second side wall 33 and the connecting wall 34, the insulation seat 30 is formed with a holding space 35 to accommodate the power supply unit 50. The first side wall 32 is provided with a first positioning slot 321 to accommodate the second circuit board 22, and the second side wall 33 is provided with a second positioning slot 331 to accommodate the third circuit board 23; whereas, the connecting wall 34 is provided with a rabbet 341 to accommodate the loudspeaker 60. It is worth mentioning that in the present embodiment, the shape of the insulation seat 30 can be changed according to the configuration of the wireless earphone, and the insulation seat 30 in the present embodiment is only one type of implementation.

The retainer 40 is used to fix the second circuit board 22 and the third circuit board 23 on the insulation seat 30. In the present embodiment, the retainer 40 includes a first retainer 41 and a third retainer 43 to fix the second circuit board 22 on the insulation seat 30, as well as a second retainer 42 and a fourth retainer 44 to fix the third circuit board 23 on the insulation seat 30.

Upon assembling, the insulation seat 30 is first installed on the first circuit board 21, and in the present embodiment, the insulation seat 30 is directly formed on the first circuit board 21 by injection molding. However, in practical application, the insulation seat 30 can be also installed on the first circuit board 21 by assembling. Next, the second circuit board 22 is bent over by an angle and is then latched in the first positioning slot 321, followed by being fastened on the first side wall 32 by the first retainer 41 and the third retainer 43, so as to fix the second circuit board 22 in the first positioning slot 321. After that, the third circuit board 23 is bent over by an angle and is then latched in the second positioning slot 331, followed by being fastened on the second side wall 33 by the second retainer 42 and the fourth retainer 44. Next, the power supply unit 50 is disposed in the holding space 35 and is made to connect electrically with the circuit loop 20. Finally, the loudspeaker 60 is disposed in the rabbet 341 and is made to connect electrically with the circuit loop 20. Accordingly, the inner module 10 can be constituted.

In order to fix the second circuit board 22 in the first positioning slot 321 more effectively, the second circuit board 22 is provided with a first positioning block 221 and a third positioning block 222 which is in adjacent to the first positioning block 221. Therefore, when the second circuit board 22 is disposed in the first positioning slot 321, it is assembled by tight fitting or interference between the first positioning block 221 and the first positioning slot 321, as well as between the third positioning block 222 and the first positioning slot 321; whereas, the first retainer 41 is disposed outside the first positioning block 221 to be engaged with the first side wall 32, and the third retainer 43 is disposed outside the third positioning block 222 to be engaged with the first side wall 32.

To fasten the first retainer 41 and the third retainer 43 on the first side wall 32 effectively, a pair of first fastening structure (not being marked, and to be described later) is disposed between the first retainer 41 and the first side wall 32, and a pair of third fastening structure (not being marked, and to be described later) is disposed between third retainer 43 and the first side wall 32. The first fastening structure includes two first fastening holes 322 which are disposed on the first side wall 32 and are separated from each other through the first positioning slot 321, as well as two first fastening bumps 411 which are disposed on the first retainer 41 and are engaged with the first fastening holes 322. The third fastening structure includes two third fastening holes 323 which are disposed on the first side wall 32 and are separated from each other through the first positioning slot 321, as well as two third fastening bumps 431 which are disposed on the third retainer 43 and are engaged with the third fastening holes 323.

Therefore, after the second circuit board 22 is bent over, passes through the first positioning block 221 and the third positioning block 222, and is fixed in the first positioning slot 321, the two first fastening bumps 411 of the first retainer 41 are engaged in the two first fastening holes 322, enabling the first retainer 41 to be fixed effectively on the first side wall 32 to prevent the first positioning block 221 from dropping out of the first positioning slot 321. Next, the two second fastening bumps 431 of the third retainer 43 are engaged in the two third fastening holes 323, allowing the third retainer 43 to be fixed effectively on the first side wall 32 to prevent the third positioning block 222 from dropping out of the first positioning slot 321.

On the other hand, to fix the third circuit board 23 effectively in the second positioning slot 331, the third circuit board 23 is provided with a second positioning block 231 and a fourth positioning block 232 which is in adjacent to the second positioning block 231. When the third circuit board 23 is disposed in the second positioning slot 331, they are assembled by tight fitting or interference between the second positioning block 231 and the second positioning slot 331, as well as between the fourth positioning block 232 and the second positioning slot 331. The second retainer 42 is disposed outside the second positioning block 231 to be engaged with the second side wall 33; whereas, the fourth retainer 44 is disposed outside the fourth positioning block 232 to be engaged with the second side wall 33.

In order to engage the second retainer 42 and the fourth retainer 44 on the second side wall 33 effectively, a second fastening structure (not marked and to be described later) is disposed between the second retainer 42 and the second side wall 33, and a fourth fastening structure (not marker and to be described later) is disposed between the fourth retainer 44 and the second side wall 33. The second fastening structure includes two second fastening holes 332 which are disposed on the second side wall 33 and are separated from each other by the second positioning slot 331, and two second fastening bumps 421 which are disposed on the second retainer 42 to be engaged with the two second fastening holes 332. The fourth fastening structure includes two fourth fastening holes 333 which are disposed on the second side wall 33 and are separated from each other by the second positioning slot 331, and two fourth fastening bumps 441 which are disposed on the fourth retainer 44 to be engaged with the two fourth fastening holes 333.

Therefore, after the third circuit board 23 is bent over, passes through the second positioning block 231 and the fourth positioning block 232, and is fixed in the second positioning slot 331, the two second fastening bumps 421 of the second retainer 42 are engaged in the two second fastening holes 332, enabling the second retainer 42 to be fixed effectively on the second side wall 33 to prevent the second positioning block 231 from dropping out of the second positioning slot 331. Next, the two fourth fastening bumps 441 of the fourth retainer 44 are engaged in the two fourth fastening holes 333, allowing the fourth retainer 44 to be fixed effectively on the second side wall 33 to prevent the fourth positioning block 232 from dropping out of the second positioning slot 331.

Accordingly, by the present invention, the inner module 10 is formed into a modularized design in advance, and the inner module 10 is integrated with the power supply unit 50 and the loudspeaker 60, so that the inner module 10 can be installed inside a casing of the wireless earphone directly, which simplifies the assembly procedure of the wireless earphone considerably, and reduces the manpower in assembling the wireless earphone significantly, thereby decreasing the assembly cost of the wireless earphone.

It is of course to be understood that the embodiments described herein is merely illustrative of the principles of the invention and that a wide variety of modifications thereto may be effected by persons skilled in the art without departing from the spirit and scope of the invention as set forth in the following claims.

What is claimed is:

1. An inner module with a retainer, comprising:
   a circuit loop, which is provided with a first circuit board, as well as a second circuit board extending from the first circuit board;
   an insulation seat which is used to fix the circuit loop, including a base plate to enclose the first circuit board and a first side wall extending from the base plate, with the first side wall being provided with a first positioning slot to accommodate the second circuit board; and
   a first retainer, which is attached to the first side wall and positioned over the first positioning slot to fix the second circuit board in the first positioning slot,
   wherein the circuit loop further includes a third circuit board which is extended from the first circuit board to oppose the second circuit board,
   wherein the insulation seat further includes a second side wall which is extended from the base plate to oppose the first side wall, with the second side wall being provided with a second positioning slot to accommodate the third circuit board,
   wherein the insulation seat further includes a connecting wall which is opposite to the base plate and connects the first side wall and the second side wall, enabling a holding space to be formed on the insulation seat to accommodate a power supply unit, with that when the power supply unit is accommodated in the holding space, the power supply unit is connected electrically with the circuit loop, and
   wherein the connecting wall is further provided with a rabbet to accommodate a loudspeaker, with that when the loudspeaker is accommodated in the rabbet, the loudspeaker is connected electrically with the circuit loop.

2. The inner module with a retainer, according to claim 1, wherein the inner module further includes a second retainer which is fixed on the second side wall to fix the third circuit board in the second positioning slot.

3. The inner module with a retainer, according to claim 2, wherein a pair of second fastening structure is disposed between the second side wall and the second retainer.

4. The inner module with a retainer, according to claim 3, wherein the second fastening structure includes a second fastening hole which is disposed on the second side wall, as well as a second fastening bump which is disposed on the second retainer to be engaged with the second fastening hole.

5. The inner module with a retainer, according to claim 1, wherein a pair of first fastening structure is disposed between the first side wall and the first retainer.

6. The inner module with a retainer, according to claim 5, wherein the first fastening structure includes a first fastening hole which is disposed on the first side wall, as well as a first fastening bump which is disposed on the first retainer to be engaged with the first fastening hole.

7. An inner module with a retainer, comprising:
   a circuit loop, which is provided with a first circuit board, as well as a second circuit board extending from the first circuit board;
   an insulation seat which is used to fix the circuit loop, including a base plate to enclose the first circuit board and a first side wall extending from the base plate, with the first side wall being provided with a first positioning slot to accommodate the second circuit board; and
   a retainer, which is fixed on the first side wall to fix the second circuit board in the first positioning slot,
   wherein the insulation seat further includes a connecting wall which is opposite to the base plate, and
   wherein the connecting wall is provided with a rabbet to accommodate a loudspeaker, with that when the loudspeaker is accommodated in the rabbet, the loudspeaker is connected electrically with the circuit loop.

* * * * *